(12) United States Patent
Yamauchi et al.

(10) Patent No.: US 8,907,731 B2
(45) Date of Patent: Dec. 9, 2014

(54) SELF-RESONANT CIRCUIT

(71) Applicant: Denso Corporation, Kariya, Aichi-pref. (JP)

(72) Inventors: Shigenori Yamauchi, Nisshin (JP); Takamoto Watanabe, Nagoya (JP); Tomohito Terazawa, Okazaki (JP)

(73) Assignee: Denso Corporation, Kariya (JP)

( * ) Notice: Subject to any disclaimer, the term of this patent is extended or adjusted under 35 U.S.C. 154(b) by 39 days.

(21) Appl. No.: 13/740,610

(22) Filed: Jan. 14, 2013

(65) Prior Publication Data

US 2013/0207733 A1 Aug. 15, 2013

(30) Foreign Application Priority Data

Feb. 9, 2012 (JP) .................................. 2012-26447

(51) Int. Cl.
| | | |
|---|---|---|
| H03B 5/30 | (2006.01) |
| H03L 7/00 | (2006.01) |
| H03L 7/08 | (2006.01) |
| G01C 19/5776 | (2012.01) |
| H03L 7/18 | (2006.01) |

(52) U.S. Cl.
CPC ... *H03L 7/00* (2013.01); *H03L 7/18* (2013.01); *H03L 7/08* (2013.01); *H03L 2207/50* (2013.01); *G01C 19/5776* (2013.01)
USPC ....... 331/16; 331/116 M; 331/96; 331/107 A; 331/1 A; 331/154; 73/61.79

(58) Field of Classification Search
CPC .................................... H03L 7/00; H03L 7/06
USPC .......... 331/16, 1 A, 107 A, 154, 96; 327/141, 327/143; 73/61.79
See application file for complete search history.

(56) References Cited

U.S. PATENT DOCUMENTS

| | | | |
|---|---|---|---|
| 5,477,196 A | 12/1995 | Yamauchi et al. | |
| 5,525,939 A | 6/1996 | Yamauchi et al. | |
| 2009/0207961 A1* | 8/2009 | Sai ................. | 375/375 |
| 2009/0267664 A1* | 10/2009 | Uozumi et al. ........... | 327/158 |

FOREIGN PATENT DOCUMENTS

| | | |
|---|---|---|
| JP | 06283984 A | 10/1994 |
| JP | 07106923 A | 4/1995 |
| JP | 07183800 A | 7/1995 |

OTHER PUBLICATIONS

Marek, J., et al, MEMS for Automotive and Consumer Applications, ISSCC Digest of Technical Papers, 2010 IEEE International, Session 1, Plenary, 1.1 (Feb. 8, 2010 @ 8:30AM), 2pp excerpt.

* cited by examiner

*Primary Examiner* — Arnold Kinkead

(57) ABSTRACT

A digitally-controlled oscillator circuit receives a digital value and generates a driving signal for driving an oscillator at a frequency according to the received digital value. A time-to-digital converter circuit receives a detection signal of oscillation of the oscillator, receives the driving signal, and detects a phase difference between the detection signal and the driving signal. A control circuit receives the detected phase difference and controls the frequency of the driving signal generated by the digitally-controlled oscillator circuit, such that the detected phase difference coincides with a predetermined resonant phase difference to resonate the oscillator.

10 Claims, 4 Drawing Sheets

SELF-RESONANT CIRCUIT

CROSS REFERENCE TO RELATED APPLICATION

This application is based on reference Japanese Patent Application No. 2012-26447 filed on Feb. 9, 2012, the disclosure of which is incorporated herein by reference.

TECHNICAL FIELD

The present disclosure relates to a self-resonant circuit, such as a digital circuit configured to cause self-resonance.

BACKGROUND

Conventionally, various sensors, such as gyro-type yaw rate sensors configured to resonate an oscillator and to detect movement of the oscillator, are employed for detecting a physical quantity.

Non-patent Document 1 discloses one example of a resonant circuit configured, as a yaw rate sensor, to send a detection signal of an oscillator to a drive circuit and to send an output signal of the drive circuit to the oscillator thereby to cause self-oscillation of the oscillator.

The drive circuit in Non-patent Document 1 includes a C/V conversion circuit, an AD converter, and a phase synchronization circuit. The C/V conversion circuit is configured to convert a capacitance signal (detection signal) received from the oscillator into an analog voltage signal. The AD converter is configured to convert the analog voltage signal received from the C/V conversion circuit into a digital signal. The phase synchronization circuit is configured to generate a synchronization signal based on the digital voltage signal received from the AD converter. Thus, the drive circuit receives, as a driving signal of the oscillator, the synchronization signal generated by the phase synchronization circuit and causes resonance of the oscillator.

[Non-Patent Document 1]
ISSCC2010, Digest of Technical Papers, pp. 6, 11 Feb. 2010

The configuration of Non-patent Document 1 requires the AD converter. It is noted that, in general, an AD converter is a relatively large and unreliable device and is apt to receive an effect of an environmental noise on its output signal. In consideration of these general factors about an AD converter, the resonant circuit as disclosed in Non-patent Document 1 and equipped with an AD converter may be hard to be downsized and may be insufficient in reliability and in tolerance for noise.

SUMMARY

It is an object of the present disclosure to produce a self-resonant circuit having a downsized configuration and being high in reliability and high in tolerance for noise.

According to an aspect of the present disclosure, a self-resonant circuit is configured to cause self-resonance in an oscillator. The self-resonant circuit comprises a digitally-controlled oscillator circuit configured to receive a digital value and to generate a driving signal at a frequency according to the received digital value for driving the oscillator. The self-resonant circuit further comprises a control circuit configured to control the frequency of the driving signal generated by the digitally-controlled oscillator circuit. The self-resonant circuit further comprises a time-to-digital converter circuit configured to receive a detection signal representing a detection value of oscillation of the oscillator, to receive the driving signal from the digitally-controlled oscillator circuit, and to detect, as digital-time information, a phase difference between the detection signal and the driving signal. The control circuit is further configured to receive the phase difference detected, as the digital-time information, by the time-to-digital converter circuit, and to execute a frequency control processing to control the frequency of the driving signal generated by the digitally-controlled oscillator circuit, such that the detected phase difference substantially coincides with a predetermined resonant phase difference to cause resonance in the oscillator.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

[Embodiments]

Figure 1:
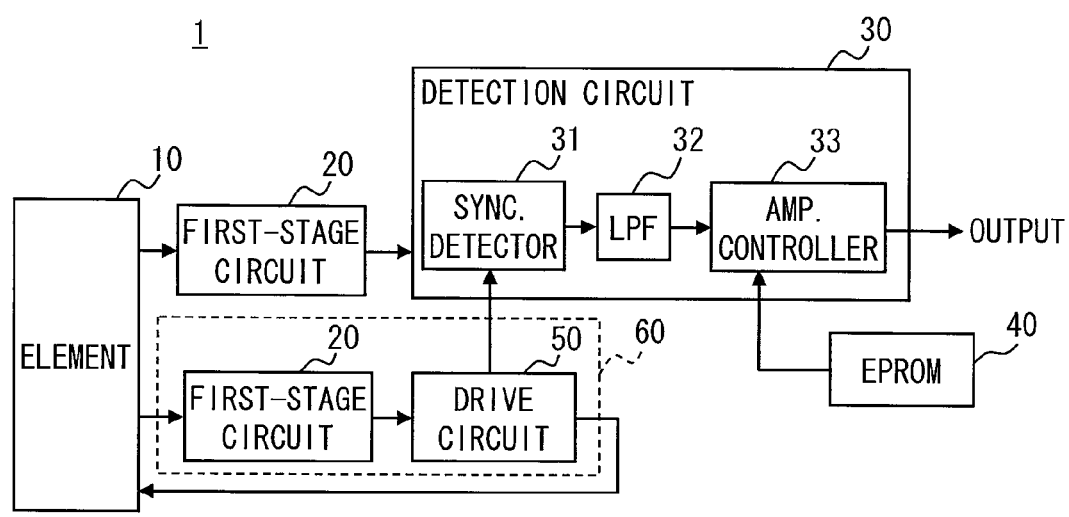
FIG. 1 is a block diagram showing a configuration of a gyro sensor device including a self-resonant circuit according to an embodiment of the present disclosure.

As shown in FIG. 1, a gyro sensor device 1 includes an element 10, two first-stage circuits 20, a signal detection circuit 30, an EPROM 40, and a drive circuit 50. The element 10, the first-stage circuits 20, the signal detection circuit 30, and the EPROM 40 may have configurations equivalent to those of corresponding components of a generally-used gyro sensor device. The first-stage circuit 20 is connected to the drive circuit 50. A self-resonant circuit 60 includes the first-stage circuit 20 and the drive circuit 50.

Figure 2:
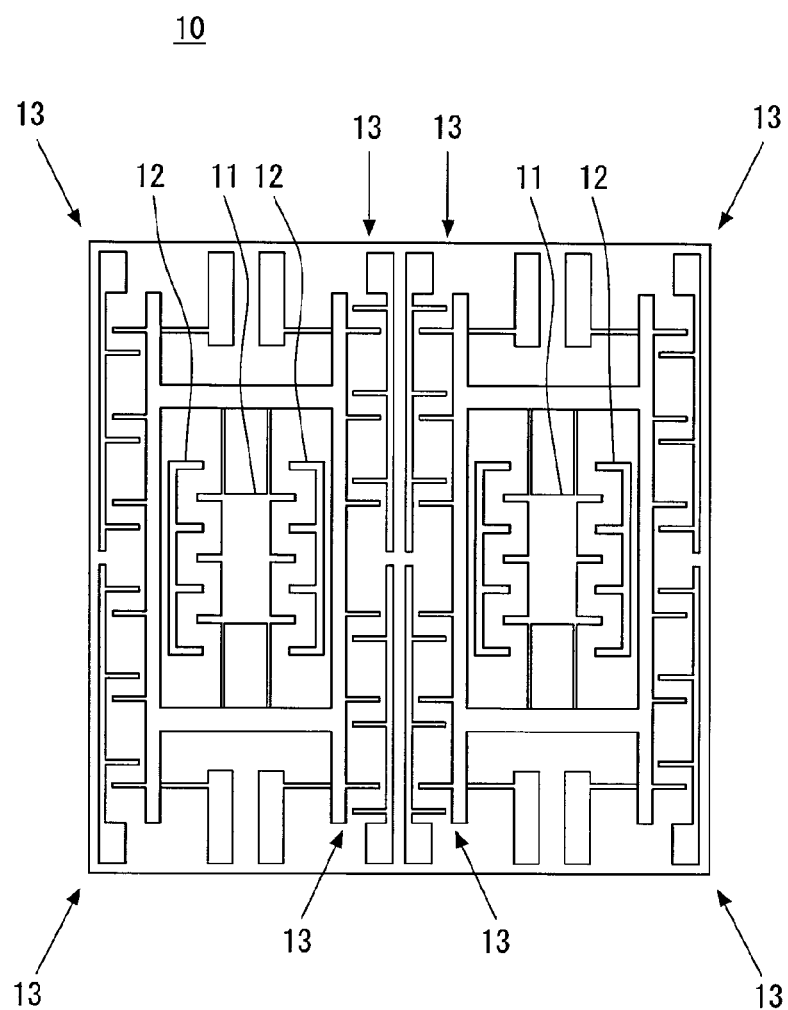
FIG. 2 is a view showing one example of an element of the gyro sensor device.

As shown in FIG. 2, the element 10 includes an oscillator 11 configured to oscillate and to receive an external force. The element 10 changes in capacitance, as the oscillator 11 is moved by being applied with an external force, while the oscillator 11 oscillates.

FIG. 2 shows one example of the element 10 having a generally-known configuration employed in, for example, a microelectromechanical system gyro sensor (MEMS gyro sensor). The element 10 includes the oscillator 11, an electrode 12, and a signal detection portion 13. The electrode 12 is configured to generate an electric field to oscillate the oscillator 11. The signal detection portion 13 is configured to detect a capacitance between the oscillator 11 and the electrode 12.

Referring to FIG. 1, the first-stage circuit 20 includes a CV conversion circuit and a comparator (none shown). Primarily, the CV conversion circuit is configured to convert the capacitance, which is detected by the signal detection portion 13 of the element 10, into a voltage signal. The voltage signal includes overlapping two signals including an angular speed signal, which represents an angular speed of the oscillator 11 of the element 10, and a signal, which represents change in voltage caused by resonance of the element 10. Secondarily, the comparator is configured to compare the voltage signal sent from the CV conversion circuit with a predetermined threshold and to send a signal representing a result of the comparison. The first stage circuit 20 outputs a voltage signal as a detection signal.

The signal detection circuit 30 is configured to extract a component (angular speed signal component) of the angular speed signal from the detection signal received from the first-stage circuit 20. The signal detection circuit 30 includes a synchronous detection portion 31, a low-pass filter 32, and an amplification controller portion 33. The synchronous detection portion 31 is configured to receive, as a reference signal, a driving signal generated by the drive circuit 50. The synchronous detection portion 31 is configured to implement synchronous detection with reference to the reference signal, thereby to remove a component (driving signal component) at a cycle of the driving signal from the detection signal.

Figure 3:
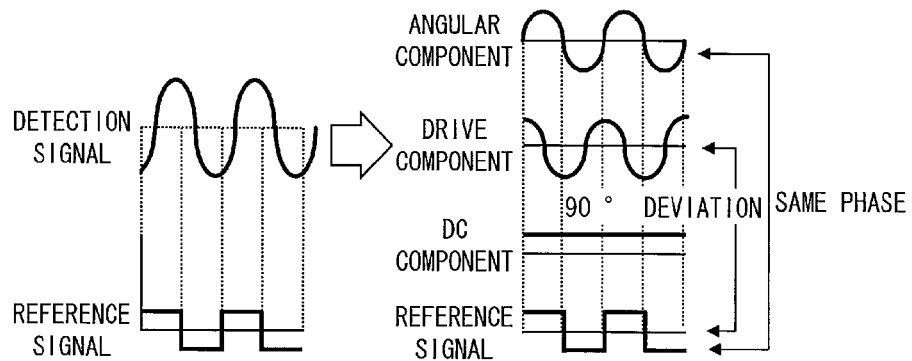
FIG. 3 is an explanatory view showing a signal component of a detection signal in a state where the element is in a resonance state.

As shown in FIG. 3, the detection signal is divided into the angular speed signal component, the driving signal component, and a direct-current component (DC component). It is generally known that the signal sent from the element is shifted by substantially 90 degrees in phase relative to an external force applied to the element being in a resonance state in which the element is in resonance. Referring to FIG. 3, the driving signal component, i.e., an output signal component caused by resonance of the oscillator 11 driven by the driving signal is shifted by substantially 90 degrees in phase relative to the driving signal received as the reference signal.

Figure 4:
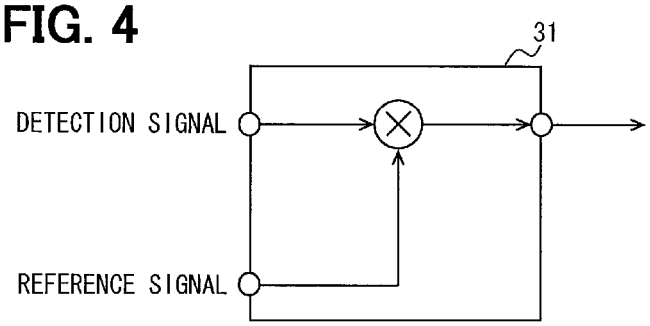
FIG. 4 is a block diagram showing a configuration of a synchronous detection portion of the gyro sensor device.

In consideration of this, as shown in FIG. 4, the synchronous detection portion 31 multiplies the detection signal by the reference signal. The present configuration removes the driving signal component, which is substantially shifted by 90 degrees relative to the reference signal, from the detection signal.

Referring to FIGS. 1 and 3, the synchronous detection portion 31 detects the signal, and the low-pass filter 32 removes a high frequency component from the detected signal. The amplification controller portion 33 further implements sensitivity correction on the signal and amplifies the signal. Thus, the amplification controller portion 33 sends the amplified signal. The EPROM 40 stores a sensitivity correction coefficient for the sensitivity correction.

Figure 5:
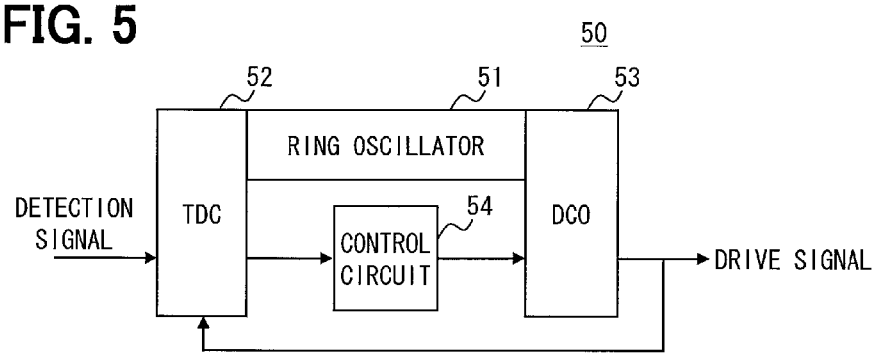
FIG. 5 is a block diagram showing a detailed configuration of a drive circuit of the gyro sensor device.

Subsequently, the configuration of the drive circuit 50 will be described. As shown in FIG. 5, the drive circuit 50 includes a ring oscillator 51, a time-to-digital converter circuit (TDC) 52, a digitally-controlled oscillator circuit (DCO) 53, and a control circuit 54.

The ring oscillator 51 is a digital oscillator circuit. The ring oscillator 51 may have a configuration equivalent to, for example, the configuration disclosed in Japanese Unexamined Patent Publication No. H7-183800. The ring oscillator 51 has multiple inverter circuits connected in a form of a ring. In the ring oscillator 51, each of the inverter circuits sequentially inverts the received pulse signal circumferentially. Each of the inverter circuits has an output terminal correspondingly to send a pulse signal at one cycle, which is a multiplication of an inverting time in each inverter circuit by a constant value. The TDC 52 and the DCO 53 receive the pulse signal sent from each of the multiple output terminals.

The TDC 52 receives the detection signal from the first-stage circuit 20. The TDC 52 further receives a feedback driving signal, which is fed back from the DCO 53. The comparator of the first-stage circuit 20 sends a pulse signal as the detection signal. The DCO 53 also sends a pulse signal as the driving signal. The TDC 52 detects, as digital-time information, a phase difference of the detection signal relative to the driving signal. That is, the TDC 52 detects, as the digital-time information, a phase lag of the detection signal relative to the driving signal. Specifically, the TDC 52 detects, as the phase difference, a time difference from a pulse leading time of the driving signal to a pulse leading time of the detection signal. The TDC 52 detects the phase difference by utilizing, as a clock pulse, the pulse signal generated by the ring oscillator 51.

The DCO 53 sends a driving signal at a cycle corresponding to a control signal received from the control circuit 54. The DCO 53 determines the cycle by utilizing, as a clock pulse, the pulse signal received from the ring oscillator 51. The driving signal sent from the DCO 53 is received by the element 10 and the TDC 52. Both the DCO 53 and the TDC 52 use the clock pulse generated by the common ring oscillator 51 in a generally-known manner disclosed in, for example, Japanese Unexamined Patent Publication No. H7-183800, as described above. Therefore, detailed description of the configuration is omitted.

The control circuit 54 controls the cycle of the driving signal, i.e., a frequency of the driving signal, such that the phase difference detected by the TDC 52 becomes a predetermined resonant phase difference. The control circuit 54 implements the present control of the cycle of the driving signal by sending, to the DCO 53, a digital signal as the control signal. The resonant phase difference is a phase difference between a phase of an external force and a phase of oscillation of a certain object when the certain object is in a resonance state. It is known that the resonant phase difference is substantially 90 degrees. It is noted that, the resonant phase difference may slightly deviate from 90 degrees for various reasons. Specifically, the resonant phase difference may be, for example, 87 degrees.

The control circuit 54 controls the frequency of the driving signal for the following reasons. It is generally known that the deviation of a vibration phase of the oscillator relative to the phase of an external force applied to the oscillator depends on a frequency. More specifically, in the present embodiment, the deviation of the phase of the detection signal relative to the phase of the driving signal depends on a frequency. More specifically, at a frequency lower than the resonance frequency, the phase lag of the vibration phase of the oscillator relative to the phase of an external force is smaller than the resonant phase difference, which is substantially 90 degrees. Alternatively, at a frequency higher than the resonance frequency, the phase lag of the vibration phase of the oscillator relative to the phase of an external force is smaller larger the resonant phase difference. For these reasons, the detected phase difference can be controlled by raising or lowering the frequency of the driving signal. It is noted that, in a case where the phase lag is smaller than the resonant phase difference, both the vibration phase of the oscillator and the phase of an external force are in the same phase. Alternatively, in a case where the phase lag is larger than the resonant phase difference, both the vibration phase of the oscillator and the phase of an external force are in reverse.

In consideration of the fact that the detected phase difference can be controlled by raising or lowering the frequency of the driving signal, the control circuit 54 implements a frequency control processing, as follows. Specifically, the control circuit 54 raises the frequency of the driving signal when the detected phase difference is smaller than the resonant phase difference. In this way, the control circuit 54 increases the detected phase difference thereby to cause the detected phase difference to approach the resonant phase difference. Alternatively, the control circuit 54 lowers the frequency of the driving signal when the detected phase difference is larger than the resonant phase difference. In this way, the control circuit 54 decreases the detected phase difference thereby to cause the detected phase difference to approach the resonant phase difference.

The control circuit 54 further implements, in advance of the frequency control processing, an approximately-resonant control processing for causing the oscillator 11 of the element 10 to be approximately in an resonance state.

Figure 6:
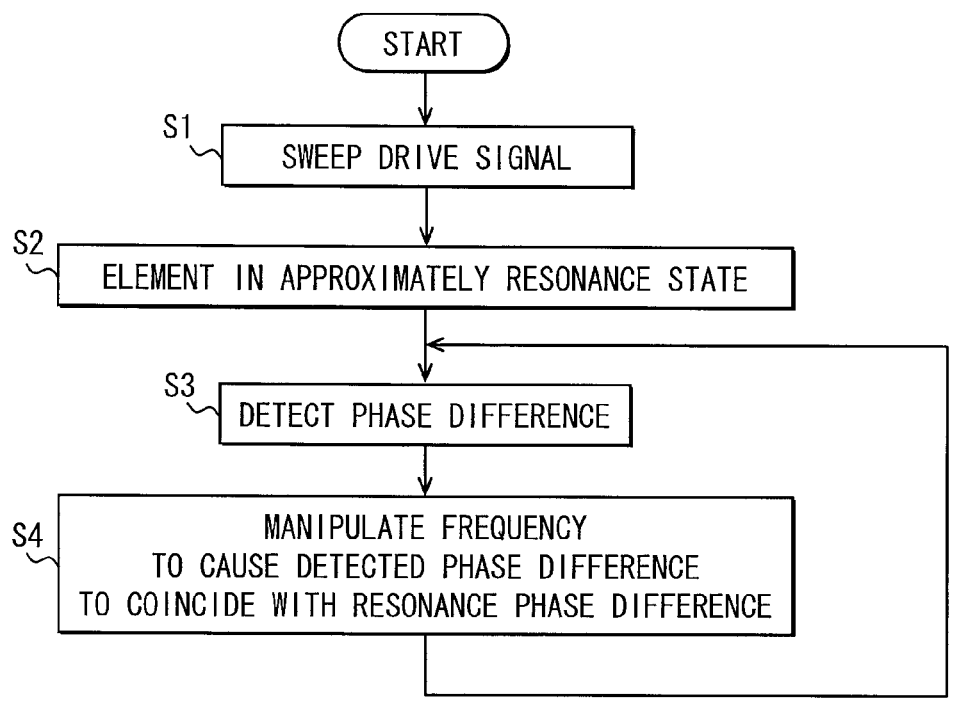
FIG. 6 is a flow chart showing a processing executed by a control circuit of the drive circuit.

The control circuit 54 executes the processing shown in FIG. 6 in an initial operation, such as in the beginning of detection. In the beginning of the detection, the detection signal does not contain the angular speed signal component. Therefore, it is deemed that the phase of the detection signal corresponds to that of the driving signal component.

In the beginning, at steps S1 and S2, the control circuit 54 executes the approximately-resonant control processing. Specifically, at step S1, the control circuit 54 sweeps the driving signal sent from the DCO 53. More specifically, the control circuit 54 sweeps the driving signal in a frequency range between a lower frequency, which is sufficiently lower than the resonance frequency of the element 10, and an upper frequency, which is sufficiently higher than the resonance frequency. On determination that the oscillator 11 of the element 10 is approximately in the resonance state, the control circuit 54 terminates the sweep of the driving signal. It is conceivable that the ring oscillator 51 is equipped with a gate delay circuit. In this case, the ring oscillator 51 may have a characteristic varying in dependence upon its temperature. In consideration of this, at step S1, the control circuit 54 implements thermal correction to enable, regardless of the ambient temperature, sweeping of the driving signal from the minimum frequency to the maximum frequency in the frequency range.

At step S2, the control circuit 54 causes the oscillator 11 of the element 10 to be approximately in the resonance state. Specifically, the control circuit 54 controls the phase difference detected by the TDC 52 in a predetermined approximately-resonant range in which the oscillator 11 of the element 10 is deemed to be in the approximately-resonant state. The approximately-resonant range is, for example, in a range between 90% of the resonant phase difference and 110% of the resonant phase difference. As the control circuit 54 sweeps the frequency of the driving signal to cause the oscillator 11 to be in the approximately-resonant state, the amplitude of the waveform of the detection signal may suddenly increase. In consideration of this, for example, the signal detection circuit may be equipped with an AD converter to convert the detection signal into a digital signal. In this configuration, the control circuit 54 may determine whether it is in the approximately-resonant state based on the amplitude of the signal sent from the AD converter. On determination of the approximately-resonant state, the processing proceeds to step S3.

At step S3 and S4, the control circuit 54 executes the frequency control processing. At step S3, the control circuit 54 detects the phase difference between the driving signal and the detection signal. Specifically, the control circuit 54 retrieves the signal representing the phase difference from the TDC 52. At step S4, the control circuit 54 manipulates the frequency of the driving signal, such that the detected phase difference coincides with the resonant phase difference. Specifically, the control circuit 54 raises the frequency of the driving signal by a predetermined value when the detected phase difference is smaller than the resonant phase difference. Alternatively, the control circuit 54 lowers the frequency of the driving signal by a predetermined value when the detected phase difference is larger than resonant phase difference. In this way, the control circuit 54 raises or lowers the frequency of the driving signal. Thereafter, the processing returns to step S3, and the control circuit 54 again detects the phase difference. On determination that the detected phase difference substantially coincides with the resonant phase difference, the control circuit 54 does not manipulate the frequency. When the control circuit 54 need not manipulate the frequency in this case, the processing may return to step S3 to continue monitoring of the phase difference. Alternatively, the control circuit 54 may terminate the processing of FIG. 6.

According to the present embodiment as described above, the DCO 53 is employed as a circuit to generate the driving signal for driving the oscillator 11 of the element 10. In addition, the TDC 52 is employed as a circuit to detect the phase difference between the driving signal and the detection signal for detecting the phase difference as the digital-time information. The present configuration enables oscillation of the oscillator without using an A/D conversion circuit. Therefore, the drive circuit 50 can be downsized. Furthermore, the self-resonant circuit 60 can be also downsized. In addition, according to the present embodiment, the DCO 53 and the TDC 52 are digital circuits. Therefore, the DCO 53 and the TDC 52 have higher reliability and have higher tolerance for noise, compared with an A/D conversion circuit, which is an analog circuitry. In view of the above facts, the self-resonant circuit 60 according to the present embodiment has a downsized configuration with a high reliability and a high tolerance for noise.

In addition, according to the present embodiment, both the TDC 52 and the DCO 53 use the clock pulse generated by the common ring oscillator 51. Therefore, a time resolution of the phase difference detected by the TDC 52 coincides with a time resolution of the driving signal oscillated by the DCO 53. With the present configuration, the cycle of the detection signal coincides with the cycle of the driving signal. Therefore, the phase difference detected by the TDC 52 can be directly utilized as the value of the phase difference for controlling the frequency.

One embodiment of the present disclosure has been described. It is noted that, the present disclosure is not limited in the above-described embodiment. The following embodiments are, at least, also included in the technical scope of the present disclosure. In addition to the following embodiments, the present disclosure may be variously practiced, as long as the practice does not deviate from a gist of the present disclosure.

In the above embodiment, both the TDC 52 and the DCO 53 use the clock pulse generated from the common ring oscillator 51. Alternatively, the TDC 52 and the DCO 53 may be equipped with clock pulse oscillator circuits, respectively, for exclusive use.

In the above embodiment, the device of the present disclosure is employed to cause self-resonance of the element 10 in the gyro sensor. It is noted that, the present disclosure is not limited in application to a gyro sensor and may be employed in another self-resonant sensor such as a resonance-type pressure sensor. The present disclosure is not limited in application to a sensor and may be employed in, for example, a micro scanner.

Summarizing the above embodiments, the self-resonant circuit 60 is configured to cause self-resonance in the oscillator. The self-resonant circuit 60 may include the digitally-controlled oscillator circuit 53, the control circuit 54, and the time-to-digital converter circuit 52. The digitally-controlled oscillator circuit 53 may be configured to receive the digital value and to generate the signal, which is at the frequency according to the received digital value, as the driving signal for driving the oscillator. The control circuit 54 may be configured to control the frequency of the signal generated by the digitally-controlled oscillator circuit. The time-to-digital converter circuit 52 may be configured to receive the detection signal, which is the detection value of oscillation of the oscillator, to receive the driving signal from the digitally-controlled oscillator circuit and to detect, as digital-time information, the phase difference between the detection signal and the driving signal. The control circuit may be further configured to receive the phase difference, which is detected as the digital-time information by the time-to-digital converter circuit. The control circuit may be further configured to execute the frequency control processing at steps S3 and S4 to control the frequency of the signal generated by the digitally-controlled oscillator circuit, such that the detected phase difference coincides with the resonant phase difference, which is the predetermined value to cause resonance in the oscillator.

It is known that the oscillator is in the resonance state when the phase difference between the phase of the driving signal and the phase of the detection signal is substantially in the resonant phase difference, which is approximately 90 degrees. According to the present disclosure, the digitally-controlled oscillator circuit is employed as the circuit for generating the driving signal for driving the oscillator. In addition, the time-to-digital converter circuit is employed as the circuit for detecting, as the digital-time information, the phase difference between the driving signal and the detection signal. The present configuration enables oscillation of the oscillator without using an A/D conversion circuit. Therefore, the self-resonant circuit can be downsized. In addition, according to the present embodiment, the digitally-controlled oscillator circuit and the time-to-digital converter circuit are digital circuits. Therefore, the digitally-controlled oscillator circuit and the time-to-digital converter circuit have higher reliability and have higher tolerance for noise, compared with an A/D conversion circuit, which is an analog circuitry. In view of the above facts, the self-resonant circuit according to the present disclosure is a downsized circuit with a high reliability and a high tolerance for noise.

The above structures of the embodiments can be combined as appropriate. The above processings such as calculations and determinations are not limited being executed by the control circuit 54. The control unit may have various structures including the control circuit 54 shown as an example.

The above processings such as calculations and determinations may be performed by any one or any combinations of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electric or electronic elements or the like. The elements producing the above processings may be discrete elements and may be partially or entirely integrated.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited in the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A self-resonant circuit configured to cause self-resonance in an oscillator, the oscillator being physically movable, the self-resonant circuit comprising:
   a digitally-controlled oscillator circuit configured
     to receive a digital value and
     to generate a driving signal at a frequency according to the received digital value for driving the oscillator;
   a control circuit configured to control the frequency of the driving signal generated by the digitally-controlled oscillator circuit; and
   a time-to-digital converter circuit configured
     to receive a detection signal representing a detection value of oscillation of the oscillator,
     to receive the driving signal from the digitally-controlled oscillator circuit, and
     to detect, as digital-time information, a phase difference between the detection signal and the driving signal, wherein
   the control circuit is further configured
     to receive the phase difference detected, as the digital-time information, by the time-to-digital converter circuit, and
     to execute a frequency control processing to control the frequency of the driving signal generated by the digitally-controlled oscillator circuit, such that the detected phase difference substantially coincides with a predetermined resonant phase difference to cause resonance in the oscillator, wherein
   the control circuit is further configured
     to execute an approximately-resonant control processing to control the phase difference, which is detected by the time-to-digital converter circuit, in a predetermined range in which the oscillator is in an approximately-resonant state, while sweeping the frequency of the driving signal in a frequency range between a lower frequency and a higher frequency and
     to implement the frequency control processing, subsequent to implementing the approximately-resonant control processing and controlling the phase difference, which is detected by the time-to-digital converter circuit, in the predetermined range.

2. The self-resonant circuit according to claim 1, wherein the control circuit is configured to execute the approximately-resonant control processing to increase an amplitude of a waveform of the phase difference.

3. The self-resonant circuit according to claim 2, wherein the predetermined range is in a range between 90% of the predetermined resonant phase difference and 110% of the predetermined resonant phase difference.

4. The self-resonant circuit according to claim 3, wherein
   the lower frequency is sufficiently lower than a resonance frequency of the oscillator, and
   the higher frequency is sufficiently higher than the resonance frequency.

5. A self-resonant circuit configured to cause self-resonance in an oscillator, the oscillator being physically movable, the self-resonant circuit comprising:
   a digitally-controlled oscillator circuit configured
     to receive a digital value and
     to generate a driving signal at a frequency according to the received digital value for driving the oscillator;

a control circuit configured to control the frequency of the driving signal generated by the digitally-controlled oscillator circuit; and a time-to-digital converter circuit configured
to receive a detection signal representing a detection value of oscillation of the oscillator,
to receive the driving signal from the digitally-controlled oscillator circuit, and
to detect, as digital-time information, a phase difference between the detection signal and the driving signal, wherein the control circuit is further configured
to receive the phase difference detected, as the digital-time information, by the time-to-digital converter circuit, and
to execute a frequency control processing to control the frequency of the driving signal generated by the digitally-controlled oscillator circuit, such that the detected phase difference substantially coincides with a predetermined resonant phase difference to cause resonance in the oscillator, wherein the predetermined resonant phase difference is substantially 90 degrees.

6. A self-resonant circuit configured to cause self-resonance in an oscillator, the oscillator being physically movable, the self-resonant circuit comprising:

a digitally-controlled oscillator circuit configured
to receive a digital value and
to generate a driving signal at a frequency according to the received digital value for driving the oscillator;

a control circuit configured to control the frequency of the driving signal generated by the digitally-controlled oscillator circuit; and a time-to-digital converter circuit configured
to receive a detection signal representing a detection value of oscillation of the oscillator,
to receive the driving signal from the digitally-controlled oscillator circuit, and
to detect, as digital-time information, a phase difference between the detection signal and the driving signal, wherein the control circuit is further configured
to receive the phase difference detected, as the digital-time information, by the time-to-digital converter circuit, and
to execute a frequency control processing to control the frequency of the driving signal generated by the digitally-controlled oscillator circuit, such that the detected phase difference substantially coincides with a predetermined resonant phase difference to cause resonance in the oscillator, wherein the oscillator is movable by being applied with an external force, while the oscillator oscillates.

7. The self-resonant circuit according to claim 6, further comprising:

a digital oscillator circuit configured to generate a clock pulse, wherein the time-to-digital converter circuit is further configured to detect the phase difference according to the clock pulse generated by the digital oscillator circuit, and the digitally-controlled oscillator circuit is further configured to measure a time according to the clock pulse generated by the digital oscillator circuit thereby to generate the driving signal at the frequency according to the received digital value.

8. The self-resonant circuit according to claim 7, wherein the digital oscillator circuit is a ring oscillator.

9. A self-resonant circuit configured to cause self-resonance in an oscillator, the oscillator being physically movable, the self-resonant circuit comprising:

a digitally-controlled oscillator circuit configured
to receive a digital value and
to generate a driving signal at a frequency according to the received digital value for driving the oscillator;

a control circuit configured to control the frequency of the driving signal generated by the digitally-controlled oscillator circuit; and a time-to-digital converter circuit configured
to receive a detection signal representing a detection value of oscillation of the oscillator,
to receive the driving signal from the digitally-controlled oscillator circuit, and
to detect, as digital-time information, a phase difference between the detection signal and the driving signal, wherein the control circuit is further configured
to receive the phase difference detected, as the digital-time information, by the time-to-digital converter circuit, and
to execute a frequency control processing to control the frequency of the driving signal generated by the digitally-controlled oscillator circuit, such that the detected phase difference substantially coincides with a predetermined resonant phase difference to cause resonance in the oscillator, the self-resonant circuit further comprising:
an electrode configured to generate an electric field to oscillate the oscillator; and
a signal detection portion configured to detect a capacitance between the oscillator and the electrode.

10. The self-resonant circuit according to claim 9, wherein the electrode is a part of a microelectromechanical device.

* * * * *